US011239098B2

(12) United States Patent
Hirochi

(10) Patent No.: US 11,239,098 B2
(45) Date of Patent: Feb. 1, 2022

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventor: Yukitomo Hirochi, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/353,114

(22) Filed: Mar. 14, 2019

(65) Prior Publication Data
US 2019/0295873 A1    Sep. 26, 2019

(30) Foreign Application Priority Data

Mar. 22, 2018   (JP) .............................. JP2018-054104

(51) Int. Cl.
*H01L 21/67* (2006.01)
*H01L 21/677* (2006.01)
(Continued)

(52) U.S. Cl.
CPC .... *H01L 21/67259* (2013.01); *H01L 21/2686* (2013.01); *H01L 21/324* (2013.01);
(Continued)

(58) Field of Classification Search
CPC .......... B22F 2003/1059; B22F 2999/00; B22F 2201/20; B22F 2202/01; B22F 2202/05
See application file for complete search history.

(56) References Cited

U.S. PATENT DOCUMENTS

2005/0188923 A1 *  9/2005  Cook ................ H01J 37/32733
                                                              118/728
2007/0273892 A1    11/2007  Asari et al.
(Continued)

FOREIGN PATENT DOCUMENTS

JP      2005-277175 A    10/2005
JP      2007-242776 A     9/2007
(Continued)

OTHER PUBLICATIONS

Japanese Office Action dated Jun. 16, 2020 for Japanese Patent Application No. 2018-054104.
(Continued)

*Primary Examiner* — Tony Tran
(74) *Attorney, Agent, or Firm* — Volpe Koenig

(57) ABSTRACT

According to one aspect of technique described herein, there is provided a technique including; a process chamber in which at least one substrate is processed; an electromagnetic wave supply part configured to supply an electromagnetic wave to the at least one substrate; a substrate holding part configured to hold the at least one substrate and at least one susceptor for suppressing the electromagnetic wave from being adsorbed to an edge of the at least one substrate; a substrate transfer part configured to transfer the at least one substrate; and a controller configured to control the substrate transfer part so as to correct a position of the at least one susceptor.

10 Claims, 9 Drawing Sheets

(51) Int. Cl.
*H01L 21/324* (2006.01)
*H01L 21/66* (2006.01)
*H01L 21/268* (2006.01)
*H01L 21/687* (2006.01)

(52) U.S. Cl.
CPC .. *H01L 21/67115* (2013.01); *H01L 21/67742* (2013.01); *H01L 21/68707* (2013.01); *H01L 22/20* (2013.01)

(56) References Cited

U.S. PATENT DOCUMENTS

2015/0325434 A1* 11/2015 Yamamoto ........ H01L 21/02321
   438/762
2018/0211840 A1* 7/2018 Yamaguchi ....... H01L 21/67248

FOREIGN PATENT DOCUMENTS

| | | |
|---|---|---|
| JP | 2008-517461 A | 5/2008 |
| JP | 2010-073952 A | 4/2010 |
| JP | 2015-070045 A | 4/2015 |
| KR | 10-0947135 B1 | 3/2010 |
| KR | 10-2018-0010250 A | 1/2018 |
| WO | 2017/056148 A1 | 4/2017 |
| WO | 2017/149663 A1 | 9/2017 |
| WO | 2018/020733 A1 | 2/2018 |

OTHER PUBLICATIONS

Korean Office Action dated Jun. 24, 2020 for Korean Patent Application No. 10-2019-0028520.

* cited by examiner

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2018-054104, filed on Mar. 22, 2018, the entire contents of which are incorporated herein by reference.

TECHNICAL FIELD

The present disclosure relates to a substrate processing apparatus, a method of manufacturing a semiconductor device, and a non-transitory computer-readable recording medium.

BACKGROUND

As one of the processes of manufacturing a semiconductor device, there is, for example, a modifying process represented by an annealing process for heating a substrate received in a process chamber through the use of a heating device to change the composition or crystal structure in a thin film formed on a front surface of the substrate or to restore a crystal defect or the like in the formed thin film. In recent semiconductor devices, miniaturization and high integration have become remarkable. Accordingly, it is required to perform a modifying process to a high-density substrate on which a pattern having a high aspect ratio is formed. As a method for modifying such a high-density substrate, for example, a heat treatment method using an electromagnetic wave has been studied.

In a conventional process using an electromagnetic wave, it is necessary to provide a cooling step of cooling a substrate heated to a high temperature by a heat treatment inside a process chamber. This may result in a degradation in productivity.

SUMMARY

Some embodiments of the present disclosure provide a technique capable of suppressing a degradation in productivity even when a substrate cooling step is provided.

Some embodiments of the present disclosure provide a technique capable of improving a susceptor position change caused by the repetition of semiconductor substrate processing in a reaction chamber and capable of assuring process reproducibility.

According to one aspect of the technique described herein, there is provided a technique including: a process chamber in which at least one substrate is processed; an electromagnetic wave supply part configured to supply an electromagnetic wave to the at least one substrate; a substrate holding part configured to hold the at least one substrate and at least one susceptor for suppressing the electromagnetic wave from being adsorbed to an edge of the at least one substrate; a substrate transfer part configured to transfer the at least one substrate; and a controller configured to control the substrate transfer part so as to correct a position of the at least one susceptor.

DETAILED DESCRIPTION

Hereinafter, various modes for carrying out the present disclosure will be described with reference to the drawings.

First Embodiment (1) Configuration of Substrate Processing Apparatus

A substrate processing apparatus 100 according to a first embodiment is configured as a single-wafer-type heat treatment apparatus that performs various heat treatments on one wafer or a plurality of wafers. The substrate processing apparatus 100 will be described as an apparatus that performs an annealing process (modifying process) through the use of an electromagnetic wave described later. In the substrate processing apparatus 100 according to this embodiment, a FOUP (Front Opening Unified Pod) (hereinafter referred to as pod) 110 is used as a storage container (carrier) that accommodates wafers 200 as substrates. The pod 110 is also used as a transfer container for transferring the wafer 200 between various substrate processing apparatuses.

Figure 1:
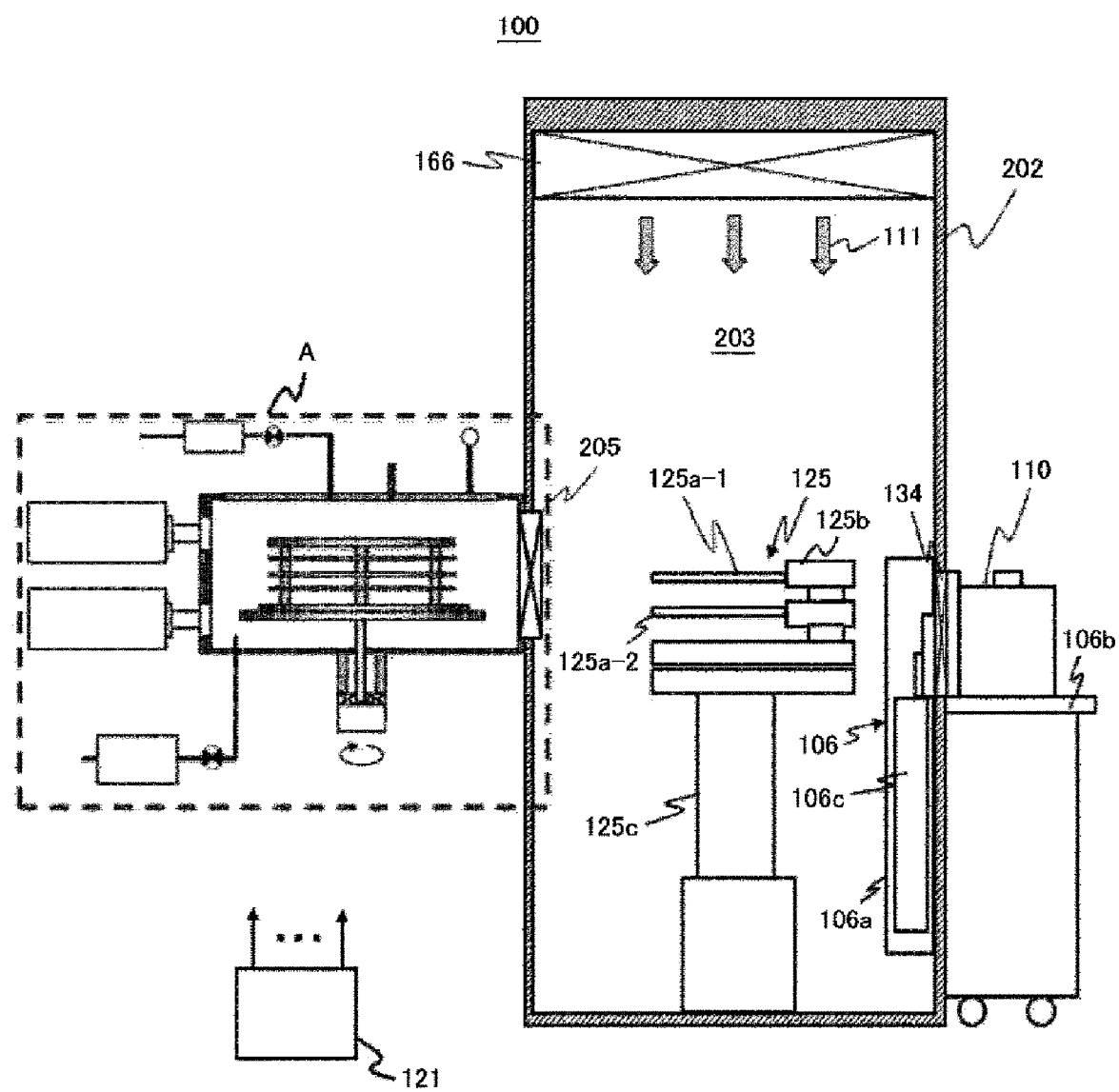
FIG. 1 is a vertical sectional view showing a schematic configuration of a substrate processing apparatus suitably used in an embodiment of the present disclosure, which is shown at the position of a processing furnace.
Figure 2:
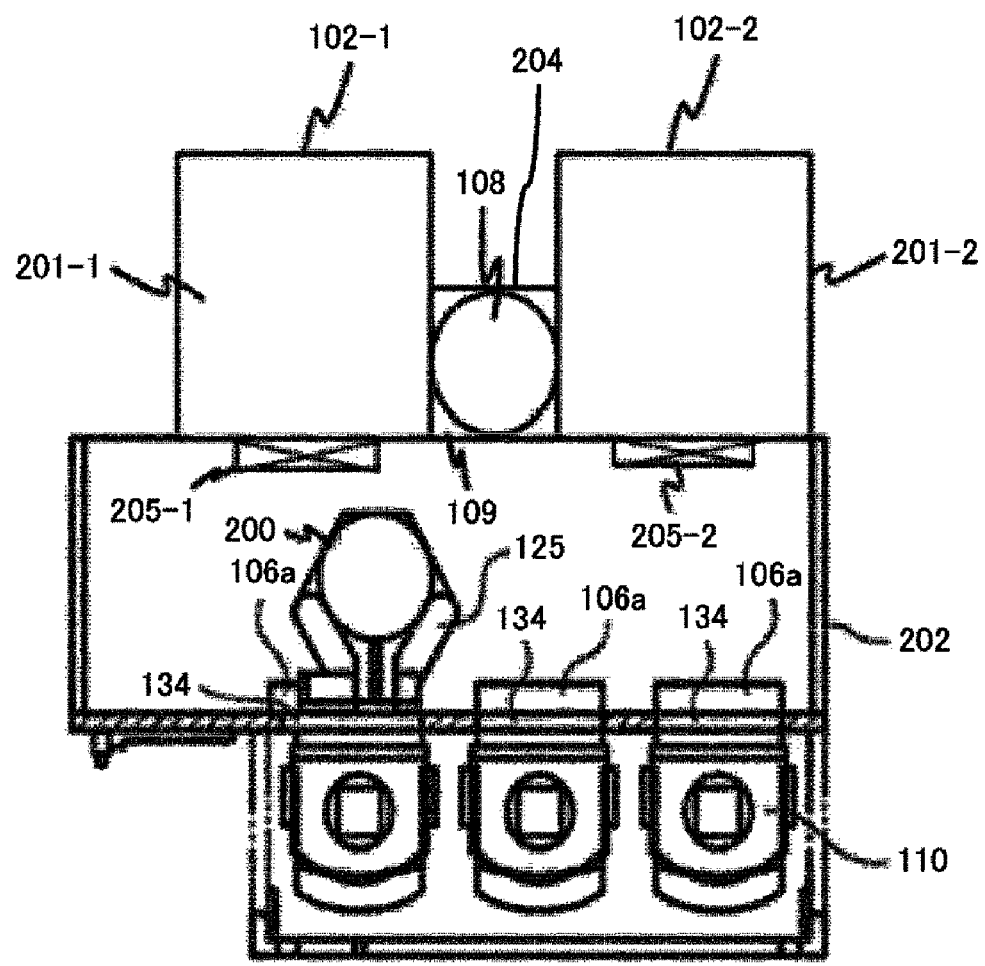
FIG. 2 is a horizontal sectional view showing the schematic configuration of the substrate processing apparatus suitably used in the embodiment of the present disclosure.

As shown in FIGS. 1 and 2, the substrate processing apparatus 100 includes a transfer housing 202 provided with a transfer chamber 203 in which the wafer 200 is transferred, and cases 102-1 and 102-2 as process containers (to be described later) installed on a side wall of the transfer housing 202 and including process chambers 201-1 and 201-2 in each of which the wafer 200 is processed. A cooling case 109 forming a cooling chamber 204 to be described later is installed between the process chambers 201-1 and 201-2.

At the right side in FIG. 1 (the lower side in FIG. 2) which is the front side of the transfer housing 202, there is arranged a load port unit (LP) 106 as a pod opening/closing mechanism for opening and closing a lid of the pod 110 and for loading and unloading the wafer 200 into and from the transfer chamber 203. The load port unit 106 includes a casing 106a, a stage 106b and an opener 106c. The stage 106b is configured to mount the pod 110 thereon and to bring the pod 110 close to a substrate loading/unloading port 134 formed at the front side of the housing of the transfer chamber 203. The opener 106c opens and closes a lid (not shown) installed in the pod 110. Furthermore, the load port unit 106 may have a function capable of purging the interior of the pod 110 with a purge gas such as an $N_2$ gas or the like. In addition, the transfer housing 202 has a below-described purge gas circulation structure for circulating a purge gas such as an $N_2$ or the like through the transfer chamber 203.

At the left side in FIG. 1 (the upper side in FIG. 2) which is the back side of the transfer housing 202, there are arranged gate valves (GV) 205-1 and 205-2 for opening and closing the process chambers 201-1 and 201-2, respectively. Inside the transfer chamber 203, there is installed a transfer machine 125 as a substrate transfer robot or a substrate transfer part which is a substrate transfer mechanism for transferring the wafer 200. The transfer machine 125 includes tweezers (arms) 125a-1 and 125a-2 as mounting parts on each of which the wafer 200 is mounted, a transfer device 125b capable of rotating or linearly moving each of the tweezers 125a-1 and 125a-2 in the horizontal direction, and a transfer device elevator 125c for raising or lowering the transfer device 125b. In cooperation between the tweezers 125a-1 and 125a-2, the transfer device 125b and the transfer device elevator 125c, the wafer 200 can be charged into or discharged from a below-described substrate holder (substrate holding part) 217, the cooling chamber 204 and the pod 110. Hereinafter, the cases 102-1 and 102-2, the process chambers 201-1 and 201-2, the tweezers 125a-1 and 125a-2 will be collectively described as a case 102, a process chamber 201 and tweezers 125a unless there is a need to specifically distinguish them.

The tweezers 125a-1 are made of a general aluminum material and are used for transferring a wafer at a low temperature and room temperature. The tweezers 125a-2 are made of a material such as aluminum or quartz having high heat resistance and poor thermal conductivity, and are used for transferring a wafer at a high temperature and room temperature. That is to say, the tweezers 125a-1 are a low-temperature substrate transfer part, and the tweezers 125a-2 are a high-temperature substrate transfer part. The high temperature tweezers 125a-2 may be configured to have heat resistance of, for example, 100 degrees C. or more, more specifically 200 degrees C. or more. A mapping sensor may be installed in the low temperature tweezers 125a-1. By installing the mapping sensor in the low temperature tweezers 125a-1, it becomes possible to check the number of wafers 200 inside the load port unit 106, the number of wafers 200 inside the process chamber 201 and the number of wafers 200 inside the cooling chamber 204.

While in the above embodiment, the tweezers 125a-1 have been described to be used as low temperature tweezers, and the tweezers 125a-2 have been described to be used as high temperature tweezers, the present disclosure is not limited thereto. The tweezers 125a-1 may be made of a material such as aluminum or quartz having high heat resistance and poor thermal conductivity and may be used for transferring a wafer at a high temperature and room temperature. The tweezers 125a-2 may be made of a general aluminum material and may be used for transferring a wafer at a low temperature and room temperature. In addition, both of the tweezers 125a-1 and 125a-2 may be made of a material such as aluminum or quartz having high heat resistance and poor thermal conductivity.

(Processing Furnace)

Figure 3:
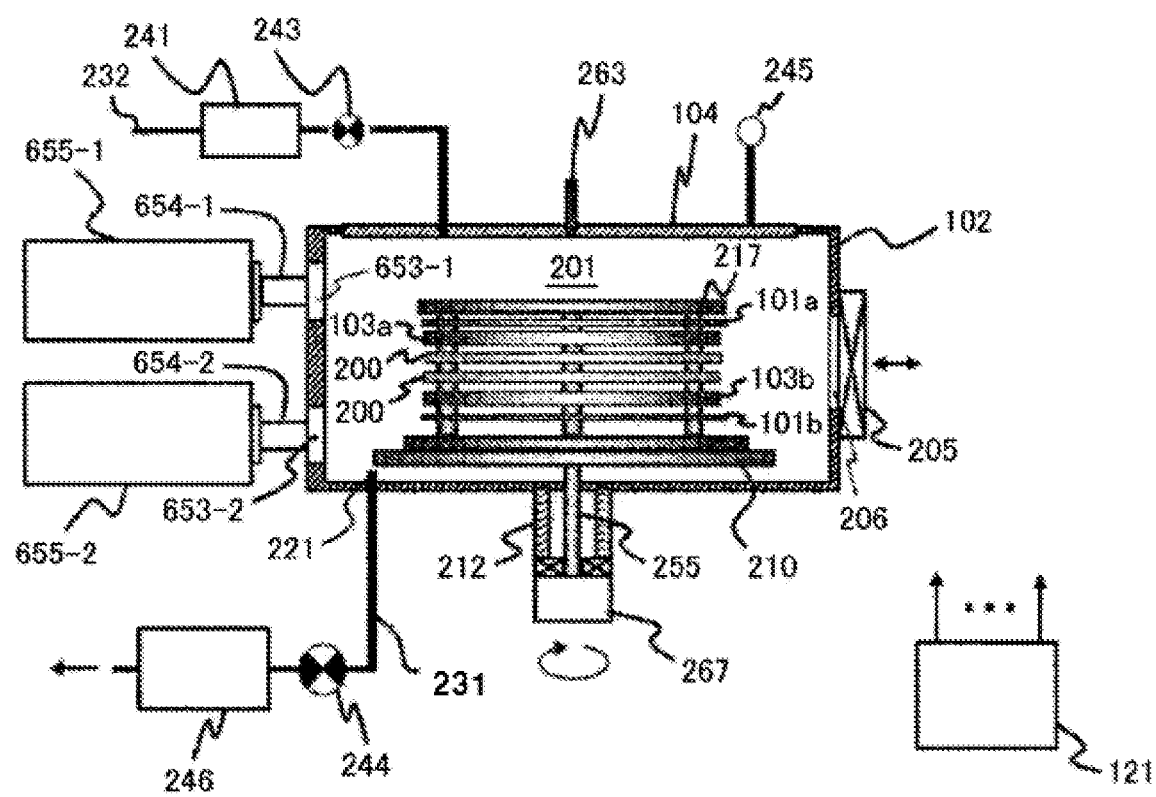
FIG. 3 is a schematic configuration diagram showing, in a vertical sectional view, the processing furnace of the substrate processing apparatus suitably used in the embodiment of the present disclosure.

A processing furnace having a substrate processing structure as shown in FIG. 3 is installed in a region A surrounded by a broken line in FIG. 1. As shown in FIG. 2, a plurality of processing furnaces is installed in this embodiment. Since the configuration of the processing furnaces is the same, only the configuration of one processing furnace will be described and the configuration of other processing furnaces will not be described.

As shown in FIG. 3, the processing furnace includes a case 102 as a cavity (process container) made of a material such as metal or the like that reflects an electromagnetic wave. In addition, a cap flange (closing plate) 104 made of a metallic material is configured to close an upper end of the case 102 via an O ring as a seal member (not shown). The internal space of the case 102 and the cap flange 104 is mainly configured as the process chamber 201 in which a substrate such as a silicon wafer or the like is processed. A reaction tube (not shown) made of quartz that allows an electromagnetic wave to pass therethrough may be disposed inside the case 102. The process container may be configured so that the interior of the reaction tube becomes a process chamber. In addition, the process chamber 201 may be configured using the case 102 having a closed ceiling without having to install the cap flange 104.

A mounting table 210 is installed inside the process chamber 201. A boat 217 as a substrate holder for holding the wafers 200 as substrates is mounted on an upper surface of the mounting table 210. In the boat 217, the wafers 200 to be processed, and susceptors 103a and 103b placed vertically above and below the wafers 200 so as to sandwich the wafers 200 therebetween are held at predetermined intervals. The susceptors 103a and 103b are made of a material such as, for example, a silicon plate (Si plate) or a silicon carbide plate (SiC plate) and are disposed above and below the wafers 200, thereby suppressing the electric field intensity from being concentratively applied onto the edges of the wafers 200. That is to say, the susceptors suppress the absorption of an electromagnetic wave to the edges of the wafers. In addition, quartz plates 101a and 101b as heat insulating plates may be held at predetermined intervals above and below the susceptors 103a and 103b, respectively. In this embodiment, each of the quartz plates 101a and 101b and each of the susceptors 103a and 103b are constituted by the same components. Hereinafter, each of the quartz plates 101a and 101b and each of the susceptors 103a and 103b will be collectively referred to as a quartz plate 101 and a susceptor 103, respectively, unless there is a need to distinguish them.

The case 102 as a process container has, for example, a circular cross section and is configured as a flat airtight container. Furthermore, the transfer housing 202 as a lower container is made of a metallic material such as aluminum (Al) or stainless steel (SUS), or quartz or the like. A space surrounded by the case 102 is sometimes referred to as the process chamber 201 or a reaction area 201 as a process space, and a space surrounded by the transfer housing 202 is sometimes referred to as the transfer chamber 203 or a transfer area 203 as a transfer space. The process chamber 201 and the transfer chamber 203 are not limited to being arranged adjacent to each other in the horizontal direction as in this embodiment but may be configured to be vertically adjacent to each other so as to raise or lower a substrate holder having a predetermined structure.

As shown in FIGS. 1, 2 and 3, a substrate loading/unloading port 206 adjacent to the gate valve 205 is formed in the side surface of the transfer housing 202. The wafer 200 is moved through the substrate loading/unloading port 206 between the process chamber 201 and the transfer chamber 203. A choke structure having a length equal to a quarter of the wavelength of an electromagnetic wave to be used is installed around the gate valve 205 or the substrate loading/unloading port 206 as a countermeasure against leakage of an electromagnetic wave to be described later.

An electromagnetic wave supply part as a heating device, which will be described in detail later, is installed in the side surface of the case 102. An electromagnetic wave such as a microwave or the like supplied from the electromagnetic wave supply part is introduced into the process chamber 201 to heat the wafer 200 and the like, thereby processing the wafer 200.

The mounting table 210 is supported by a shaft 255 as a rotating shaft. The shaft 255 penetrates a bottom portion of the process chamber 201. Furthermore, the shaft 255 is connected to a drive mechanism 267 that performs a rotating operation outside the process chamber 201. By driving the drive mechanism 267 to rotate the shaft 255 and the mounting table 210, it is possible to rotate the wafer 200 mounted on the boat 217. The periphery of a lower end portion of the shaft 255 is covered by a bellows 212, whereby the interiors of the process chamber 201 and the transfer area 203 are kept airtight.

Depending on the height of the substrate loading/unloading port 206, the mounting table 210 may be raised or lowered by the drive mechanism 267 so that the wafer 200 is located at a wafer transfer position at the time of transferring the wafer 200 and so that the wafer 200 is raised or lowered to a processing position (wafer processing position) inside the process chamber 201 at the time of processing the wafer 200.

An exhaust part for exhausting an internal atmosphere of the process chamber 201 is installed below the process chamber 201 and at an outer peripheral side of the mounting table 210. As shown in FIG. 3, an exhaust port 221 is formed in the exhaust part. An exhaust pipe 231 is connected to the exhaust port 221. A pressure regulator 244 such as an APC valve or the like for controlling an opening degree of a valve depending on an internal pressure of the process chamber 201, and a vacuum pump 246 are sequentially and serially connected to the exhaust pipe 231.

In this regard, the pressure regulator 244 is not limited to the APC valve as long as it can receive information of the internal pressure of the process chamber 201 and a feedback signal from a pressure sensor 245 (to be described later) and can adjust an exhaust amount. The pressure regulator 244 may be configured so as to use an ordinary opening/closing valve and a pressure regulation valve in combination.

The exhaust part (also referred to as an exhaust system or an exhaust line) is mainly constituted by the exhaust port 221, the exhaust pipe 231 and the pressure regulator 244. An exhaust port may be formed to surround the mounting table 210 so that the gas can be exhausted from the entire periphery of the wafer 200. In addition, the vacuum pump 246 may be added to the configuration of the exhaust part.

A gas supply pipe 232 is installed in the cap flange 104 to supply various substrate processing gases such as an inert gas, a precursor gas, a reaction gas and the like into the process chamber 201. In the gas supply pipe 232, a mass flow controller (MFC) 241 which is a flow rate controller (flow rate control part) and a valve 243 which is an opening/closing valve are installed sequentially from the upstream side. For example, a nitrogen ($N_2$) gas source for supplying a nitrogen ($N_2$) gas as an inert gas is connected at the upstream side of the gas supply pipe 232. The nitrogen ($N_2$) gas is supplied into the process chamber 201 via the MFC 241 and the valve 243. In the case of using plural kinds of gases at the time of substrate processing, the plural kinds of gases can be supplied by using a configuration in which a gas supply pipe having an MFC as a flow rate controller and a valve as an opening/closing valve installed sequentially from the upstream side is connected to the gas supply pipe 232 at the downstream side of the valve 243. A gas supply pipe provided with an MFC and a valve may be installed for each type of gas.

A gas supply system (gas supply part) is mainly constituted by the gas supply pipe 232, the WC 241 and the valve 243. In a case of supplying an inert gas to the gas supply system, the gas supply system is also referred to as an inert gas supply system. As the inert gas, in addition to the $N_2$ gas, it may be possible to use, for example, a rare gas such as an Ar gas, a He gas, a Ne gas, a Xe gas or the like.

A temperature sensor 263 as a non-contact type temperature measurement device is installed in the cap flange 104. By adjusting the output of a below-described microwave oscillator 655 on the basis of a temperature information detected by the temperature sensor 263, it is possible to heat the substrate so that the substrate has a desired temperature distribution. The temperature sensor 263 is constituted by, for example, a radiation thermometer such as an IR (Infrared Radiation) sensor or the like. The temperature sensor 263 is installed so as to measure a surface temperature of the quartz plate 101a or a surface temperature of the wafer 200. In the case where the above-described susceptor as a heating element is installed, the temperature sensor 263 may be configured to measure a surface temperature of the susceptor. In this embodiment, in the case of specifying the temperature of the wafer 200 (wafer temperature), it may mean a wafer temperature converted by below-described temperature conversion data, namely an estimated wafer temperature, a temperature obtained by directly measuring the temperature of the wafer 200 with the temperature sensor 263, or both.

By acquiring in advance the transition in temperature change for each of the quartz plate 101 or the susceptor 103 and the wafer 200 through the use of the temperature sensor 263, the temperature conversion data indicating the correlation between the temperature of the quartz plate 101 or the susceptor 103 and the temperature of the wafer 200 may be stored in a memory device 121c or an external memory device 123. By preparing in advance the temperature conversion data as described above, the temperature of the wafer 200 can be estimated merely by measuring the temperature of the quartz plate 101. Based on the estimated temperature of the wafer 200, it is possible to control the output of the microwave oscillator 655, i.e., the heating device.

The means for measuring the temperature of a substrate is not limited to the above-described radiation thermometer. Temperature measurement may be performed by using a thermocouple, or may be performed by using both a thermocouple and a non-contact type thermometer. However, in the case of performing the temperature measurement with the thermocouple, it is necessary to arrange the thermocouple near the wafer 200 to perform the temperature measurement. That is to say, it is necessary to arrange the thermocouple inside the process chamber 201. Therefore, the thermocouple itself may be heated by the microwave supplied from the microwave oscillator described later. This makes it impossible to accurately measure the temperature. Accordingly, it is preferable to use a non-contact type thermometer as the temperature sensor 263.

Furthermore, the temperature sensor 263 is not limited to being installed in the cap flange 104, but may be installed in the mounting table 210. Moreover, the temperature sensor 263 may not only be directly installed in the cap flange 104 or the mounting table 210 but also be configured to indirectly measure the temperature by reflecting the radiation light from a measurement window formed in the cap flange 104 or the mounting table 210 through the use of a mirror or the like. In addition, the number of the temperature sensor 263 is not limited to one. A plurality of temperature sensors may be installed.

Electromagnetic wave introduction ports 653-1 and 653-2 are installed in the side wall of the case 102. One end of each of the waveguides 654-1 and 654-2 for supplying an electromagnetic wave (microwave) into the process chamber 201 is connected to each of the electromagnetic wave introduction ports 653-1 and 653-2. Microwave oscillators (electromagnetic wave sources) 655-1 and 655-2 as heat sources for supplying an electromagnetic wave into the process chamber 201 to heat the interior of the process chamber 201 are connected to the other ends of the waveguides 654-1 and 654-2. Each of the microwave oscillators 655-1 and 655-2 supplies an electromagnetic wave such as a microwave or the like to the waveguides 654-1 and 654-2. As the microwave oscillators 655-1 and 655-2, a magnetron, a klystron or the like may be used. Hereinafter, the electromagnetic wave introduction ports 653-1 and 653-2, the waveguides 654-1 and 654-2 and the microwave oscillators 655-1 and 655-2 will be collectively described as an electromagnetic wave introduction port 653, a waveguide 654 and a microwave oscillator 655, respectively, unless there is a particular need to distinguish them.

The frequency of the electromagnetic wave generated by the microwave oscillator 655 may be controlled so as to fall within a frequency range of from 13.56 MHz to 24.125 GHz. More specifically, the frequency of the electromagnetic wave may be controlled to become a frequency of 2.45 GHz or 5.8 GHz. In this regard, the frequencies of the microwave oscillators 655-1 and 655-2 may be the same or may be different from each other.

In this embodiment, two microwave oscillators 655 are arranged in the vicinity of the side surface of the case 102. However, the present disclosure is not limited thereto. One or more microwave oscillators 655 may be installed. Further, the microwave oscillators 655 may be installed in different side surfaces such as side surfaces facing each other in the case 102. An electromagnetic wave supply part (also referred to as electromagnetic wave supply device, microwave supply part, or microwave supply device) as a heating device is mainly constituted by the microwave oscillators 655-1 and 655-2, the waveguides 654-1 and 654-2, and the electromagnetic wave introduction ports 653-1 and 653-2.

A controller 121 to be described later is connected to each of the microwave oscillators 655-1 and 655-2. The temperature sensor 263 for measuring the temperature of the quartz plate 101a or 101b or the wafer 200 received in the process chamber 201 is connected to the controller 121. The temperature sensor 263 measures the temperature of the quartz plate 101 or the wafer 200 according to the above-described method and transmits the measurement result to the controller 121. The controller 121 controls the output of the microwave oscillators 655-1 and 655-2, thereby controlling the heating of the wafer 200. As the method of controlling the heating performed by the heating device, it may be possible to use a method of controlling the heating of the wafer 200 by controlling voltage inputted to the microwave oscillator 655, a method of controlling the heating of the wafer 200 by changing the ratio of the time to turn on the power supply of the microwave oscillator 655 and the time to turn off the power supply of the microwave oscillator 655, and the like.

In this regard, the microwave oscillators 655-1 and 655-2 are controlled by the same control signal transmitted from the controller 121. However, the present disclosure is not limited thereto. The microwave oscillators 655-1 and 655-2 may be individually controlled by transmitting individual control signals from the controller 121 to the microwave oscillators 655-1 and 655-2.

(Cooling Chamber)

Figure 4:
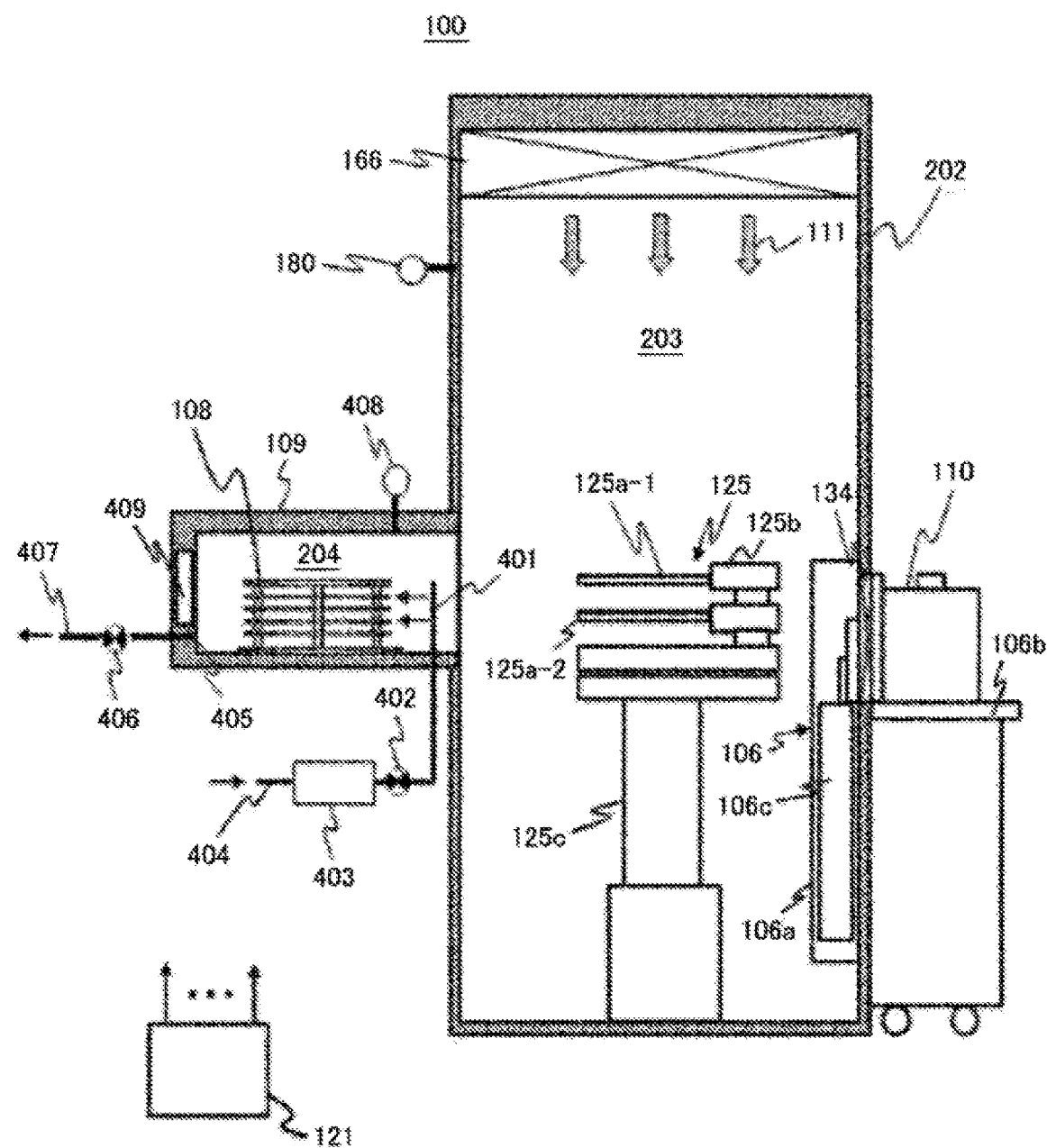
FIG. 4 is a vertical sectional view showing the schematic configuration of the substrate processing apparatus suitably used in the embodiment of the present disclosure, which is shown at the position of a cooling chamber.
Figure 5A:
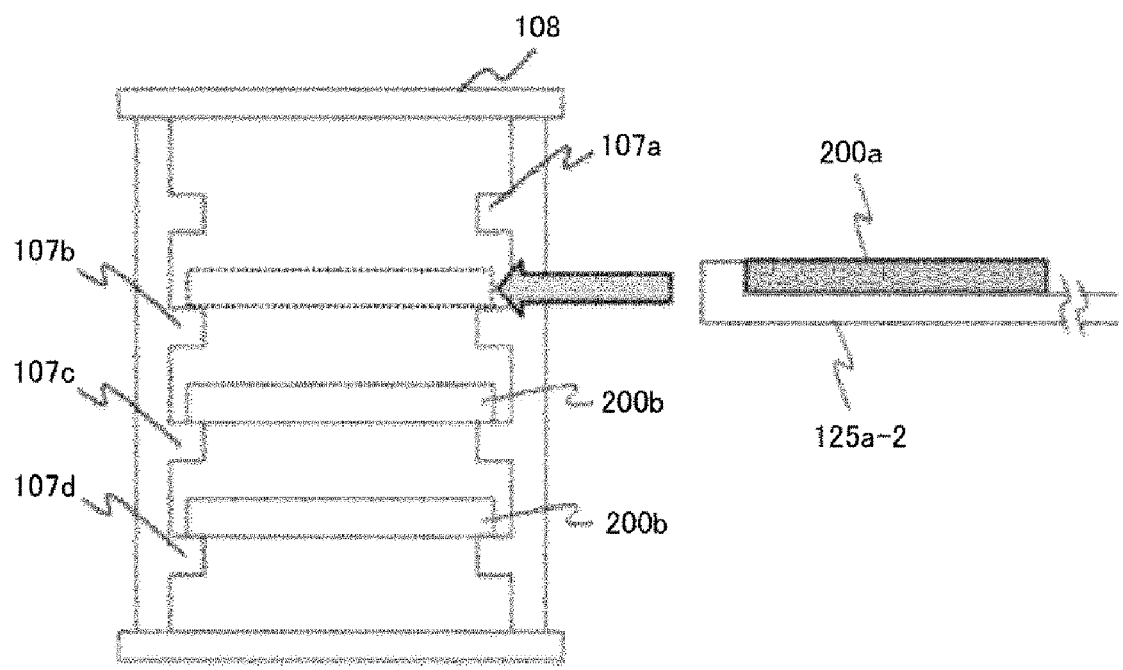
FIG. 5A is a diagram schematically showing a method of transferring a wafer to the cooling chamber.
Figure 5B:
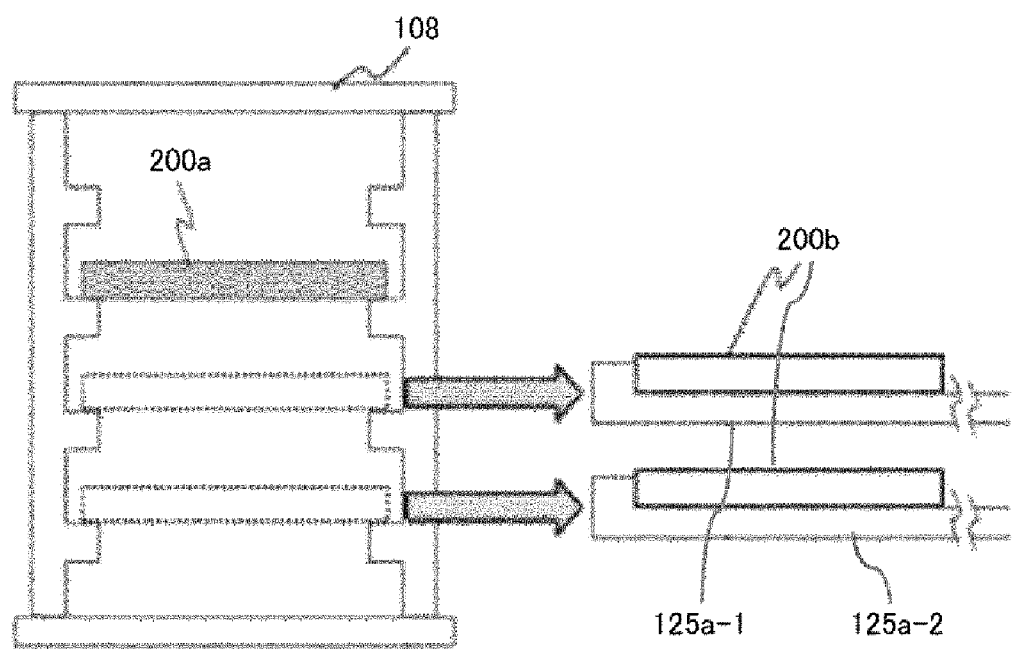
FIG. 5B is a diagram schematically showing a method of unloading a cooled wafer from the cooling chamber.

As shown in FIGS. 2 and 4, the cooling chamber (also referred to as cooling area or cooling part) 204 as a cooling region for cooling the wafer 200 subjected to a predetermined substrate process is formed by a cooling case 109 at a lateral side of the transfer chamber 203 between the process chambers 201-1 and 201-2 at a position substantially equidistant from the process chambers 201-1 and 201-2, specifically, so that transfer distances from the substrate loading/unloading ports 206 of the process chambers 201-1 and 201-2 become substantially the same. A wafer-cooling mounting part (also referred to as a cooling stage) (hereinafter referred to as CS) 108 having the same structure as the boat 217 as a substrate holder is installed inside the cooling chamber 204. As shown in FIGS. 5A and 5B to be described later, the CS 108 is configured so that the plurality of wafers 200 can be horizontally held in multiple stages in the vertical direction by a plurality of wafer holding grooves 107a to 107d. Furthermore, in the cooling case 109, there is installed a gas supply nozzle (cooling-chamber gas supply nozzle) 401 as a cooling-chamber purge gas supply part for supplying an inert gas as a purge gas (a cooling-chamber purge gas) for purging an internal atmosphere of the cooling chamber 204 via a gas supply pipe (cooling-chamber gas supply pipe) 404 at a predetermined first gas flow rate. The gas supply nozzle 401 may be an opened nozzle whose nozzle end portion is opened. It is preferably to use a multi-hole nozzle having a plurality of gas supply holes formed in a side wall facing the side of the CS 108 in the respective nozzle. In addition, there may be installed a plurality of gas supply nozzles 401. The purge gas supplied from the gas supply nozzle 401 may be used as a cooling gas for cooling the processed wafer 200 mounted on the CS 108.

As shown in FIG. 2, the cooling chamber 204 may be installed between the process chamber 201-1 and the process chamber 201-2. Thus, a movement distance (movement time) between the process chamber 201-1 and the cooling chamber 204 can be made equal to a movement distance between the process chamber 201-2 and the cooling chamber 204, thus making Takt times equal to each other. In addition, by installing the cooling chamber 204 between the process chamber 201-1 and the process chamber 201-2, it is possible to improve the transfer throughput.

As shown in FIGS. 5A and 5B, the CS 108 installed inside the cooling chamber 204 can hold four wafers 200. That is to say, the CS 108 is configured to be able to cool at least twice as many wafers 200 (four wafers) as the wafers 200 (two wafers) heated in the process chamber 201-1 or 201-2.

Furthermore, in the cooling chamber 204, there are installed an exhaust port 405 for exhausting the cooling-chamber purge gas therethrough, an opening/closing valve (or APC valve) 406 as a cooling-chamber exhaust valve for adjusting a gas exhaust amount, and an exhaust pipe 407 as a cooling-chamber exhaust pipe. A cooling-chamber vacuum pump (not shown) for positively exhausting the internal atmosphere of the cooling chamber 204 may be installed in the exhaust pipe 407 at the rear stage of the opening/closing valve 406. The exhaust pipe 407 may be connected to a purge gas circulation structure for circulating the internal atmosphere of the transfer chamber 203 to be described later.

A cooling-chamber pressure sensor (cooling-chamber pressure gauge) 408 for detecting the internal pressure of the cooling chamber 204 is installed in the cooling case 109. An MFC 403 serving as a cooling-chamber MFC and a valve 402 serving as a cooling-chamber valve are controlled by the below-described controller 121 so that a differential pressure between the internal pressure of the transfer chamber 203 detected by the transfer-chamber pressure sensor (transfer-chamber pressure gauge) 180 and the internal pressure of the cooling chamber 204 is kept constant. Thus, the supply and cutoff of the purge gas are performed. Furthermore, the opening/closing valve 406 and the cooling-chamber vacuum pump are controlled to control the exhaust and cutoff of the purge gas. By virtue of these control operations, the internal pressure of the cooling chamber 204 and the temperature of the wafer 200 mounted on the CS 108 are controlled. A cooling-chamber gas supply system (first gas supply part) is mainly constituted by the gas supply nozzle 401, the valve 402, the MFC 403 and the gas supply pipe 404. A cooling-chamber gas exhaust system (cooling-chamber gas exhaust part) is mainly constituted by the exhaust port 405, the opening/closing valve 406 and the exhaust pipe 407. The cooling-chamber vacuum pump may be included in the cooling-chamber gas exhaust system. Further, a temperature sensor (not shown) for measuring the temperature of the wafer 200 mounted on the CS 108 may be installed inside the cooling chamber 204. The respective wafer holding grooves 107a to 107d will be collectively described as a wafer holding groove 107 unless there is a need to specifically distinguish them.

(Control Device)

Figure 6:
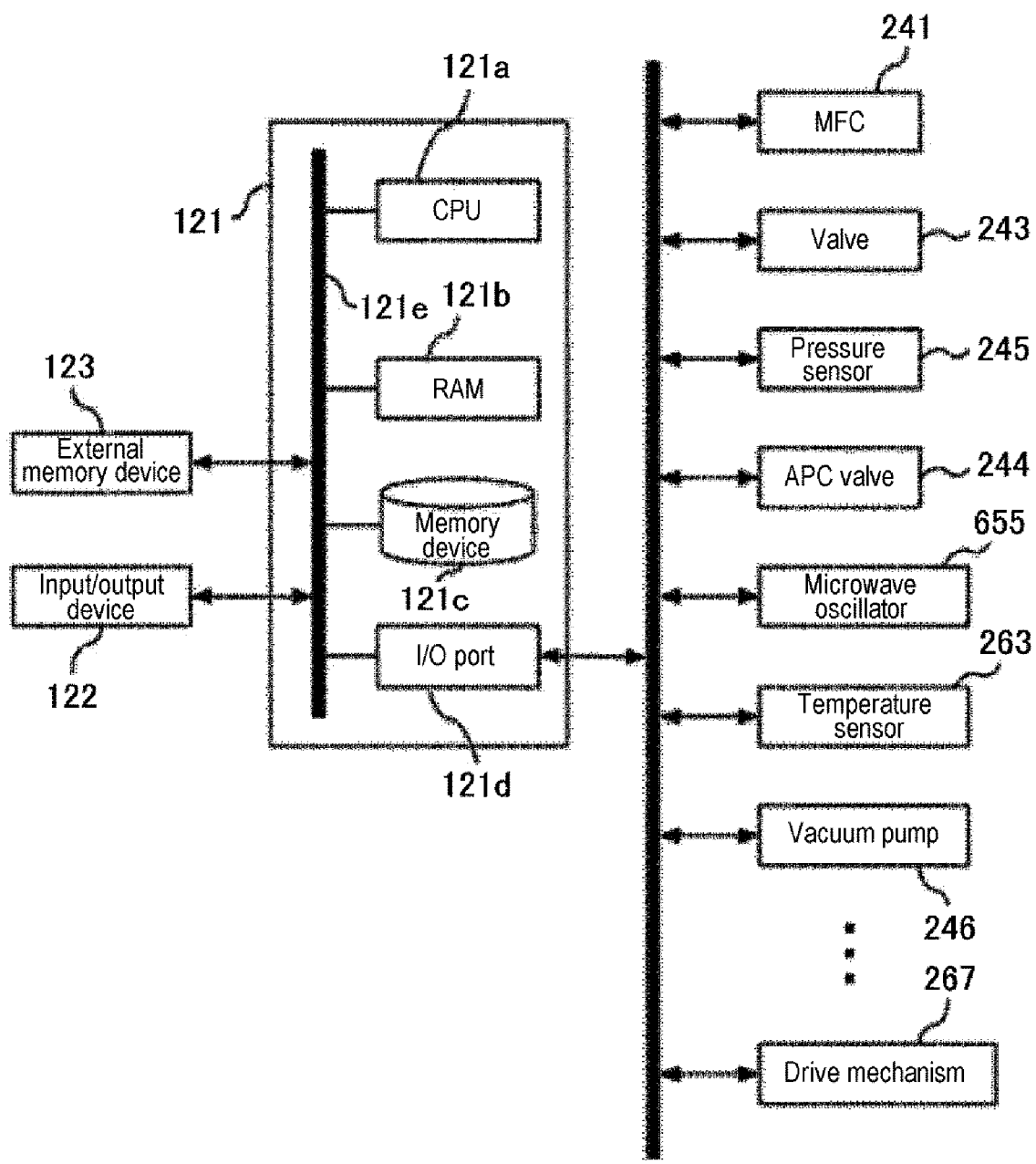
FIG. 6 is a schematic configuration diagram of a controller of the substrate processing apparatus suitably used in the embodiment of the present disclosure.

As shown in FIG. 6, the controller 121 as a control part (control device or control means) is configured as a computer including a CPU (Central Processing Unit) 121a, a RAM (Random Access Memory) 121b, the memory device 121c and an I/O port 121d. The RAM 121b, the memory device 121c and the I/O port 121d are configured to exchange data with the CPU 121a via an internal bus 121e. An input/output device 122 formed of, for example, a touch panel or the like is connected to the controller 121.

The memory device 121c is constituted by, for example, a flash memory, a hard disc drive (HDD), or the like. A control program for controlling the operations of the substrate processing apparatus, a process recipe in which sequences and conditions of an annealing (modifying) process are written, and the like are readably stored in the memory device 121c. The process recipe functions as a program for causing the controller 121 to execute each sequence in a substrate processing process (to be described later) to obtain a predetermined result. Hereinafter, the process recipe and the control program will be generally and simply referred to as a "program". When the term "program" is used herein, it may indicate a case of including only the process recipe, a case of including only the control program, or a case of including both the process recipe and the control program. The RAM 121b is configured as a memory area (work area) in which a program or data read by the CPU 121a is temporarily stored.

The I/O port 121d is connected to the transfer machine 125, the MFC 241, the valve 243, the pressure sensor 245, the APC valve 244, the vacuum pump 246, the temperature sensor 263, the drive mechanism 267, the microwave oscillator 655, and the like.

The CPU 121a is configured to read the control program out the memory device 121c and execute the same. The CPU 121a is also configured to read the process recipe out the memory device 121c according to an operation command inputted from the input/output device 122. The CPU 121a is configured to control, according to the contents of the process recipe thus read, the substrate transfer operation performed by the transfer machine 125, the flow rate adjustment operation of various gases performed by the MFC 241, the opening/closing operation of the valve 243, the pressure adjustment operation performed by the APC valve 244 based on the pressure sensor 245, the startup and stoppage of the vacuum pump 246, the output adjustment operation of the microwave oscillator 655 based on the temperature sensor 263, the rotation, rotation speed adjustment or raising/lowering operations of the mounting table 210 (or the boat 217) performed by the drive mechanism 267, and the like.

The controller 121 may be configured by installing, on a computer, the above-described program stored in an external memory device (e.g., a magnetic disk such as a hard disk or the like, an optical disk such as a CD or the like, a magneto-optical disk such as an MO or the like, or a semiconductor memory such as a USB memory or the like) 123. The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. The provision of the program to the computer may be performed by using a communication means such as the Internet or a dedicated line without using the external memory device 123.

(2) Substrate Processing Process

Next, as a process of manufacturing a semiconductor device using the processing furnace of the above-described substrate processing apparatus 100, for example, an example of a method of modifying (crystallizing) an amorphous silicon film as a silicon-containing film formed on a substrate will be described with reference to a processing flow shown in FIG. 7. In the following description, the operations of the respective parts constituting the substrate processing apparatus 100 are controlled by the controller 121. As with the structure of the processing furnace described above, even in the substrate processing process of this embodiment, the processing contents, namely the same recipe is used in a plurality of processing furnaces. Therefore, only the substrate processing process using a single processing furnace will be described and the description of the substrate processing process using other processing furnaces will be omitted.

When the term "wafer" is used herein, it may refer to "a wafer itself" or "a laminated body of a wafer and a predetermined layer or film formed on a front surface of the wafer." Furthermore, when the phrase "a front surface of a wafer" is used herein, it may refer to "a front surface of a wafer itself" or "a surface of a predetermined layer or the like formed on a wafer." Moreover, the expression "a predetermined layer is formed on a wafer" as used herein may mean that "a predetermined layer is directly formed on a front surface of a wafer itself" or that "a predetermined layer is formed on a layer or the like formed on a wafer." In addition, when the term "substrate" or "semiconductor substrate" is used herein, it may be synonymous with the term "wafer."

(Substrate Taking-out Step S801)

As shown in FIG. 1, the transfer machine 125 takes out a predetermined number of wafers 200 as workpieces from the pod 110 opened by the load port unit 106, and mounts the wafers 200 on both of the tweezers 125a-1 and 125a-2. That is to say, two wafers taken out from the pod 110 are mounted on the low-temperature tweezers 125a-1 and the high-temperature tweezers 125a-2, respectively.

(Substrate Loading Step S802)

As shown in FIGS. 1 and 3, the wafers 200 mounted on both of the tweezers 125a-1 and 125a-2 are loaded (boat-loaded) into the process chamber 201 by the opening/closing operation of the gate valve 205. That is to say, the two wafers mounted on the low-temperature tweezers 125a-1 and the high-temperature tweezers 125a-2 are loaded into the process chamber 201.

(In-Furnace Pressure/Temperature Adjustment Step S803)

After the loading of the boat 217 into the process chamber 201 is completed, the internal atmosphere of the process chamber 201 is controlled so that the internal pressure of the process chamber 201 becomes a predetermined pressure (for example, 10 to 102,000 Pa). Specifically, while performing exhaust by the vacuum pump 246, an opening degree of a valve of the pressure regulator 244 is feedback-controlled based on an internal pressure information detected by the pressure sensor 245 so that the internal pressure of the process chamber 201 is set to the predetermined pressure. At the same time, the electromagnetic wave supply part may be controlled to perform pre-heating and may be controlled to perform heating to a predetermined temperature (S803). In a case where the temperature is raised to a predetermined substrate processing temperature by the electromagnetic wave supply part, it is preferable that the temperature raising is performed by an output smaller than the output of a below-described modifying process so that the wafer 200 is not deformed or broken. In the case where substrate processing is performed under an atmospheric pressure, after only the internal temperature of the furnace is adjusted without adjusting the internal pressure of the furnace, the process may be controlled so as to proceed to an inert gas supply step S804 to be described later.

(Inert Gas Supply Step S804)

After the internal pressure and the internal temperature of the process chamber 201 are controlled to have predetermined values in the in-furnace pressure/temperature adjustment step S803, the drive mechanism 267 rotates the shaft 255 and rotates the wafers 200 via the boat 217 mounted on the mounting table 210. At this time, an inert gas such as a nitrogen gas or the like is supplied through the gas supply pipe 232 (S804). Furthermore, at this time, the internal pressure of the process chamber 201 is regulated to a predetermined value falling within a range of 10 Pa to 102,000 Pa, for example, a range of 101,300 Pa to 101,650 Pa. The shaft 255 may be rotated during the substrate loading step S802, namely after the wafers 200 have been loaded into the process chamber 201.

(Modifying Step S805)

When the interior of the process chamber 201 is maintained at the predetermined pressure, the microwave oscillator 655 supplies a microwave into the process chamber 201 via the above-described respective parts. By supplying the microwave into the process chamber 201, the wafer 200 is heated to a temperature of 100 degrees C. or more and 1,000 degrees C. or less, specifically, 400 degrees C. or more and 900 degrees C. or less, more specifically 500 degrees C. or more and 700 degrees C. or less. By performing the substrate processing at such a temperature, the wafer 200 efficiently absorbs the microwave. This makes it possible to increasing the speed of the modifying process. In other words, if the wafer 200 is processed at a temperature lower than 100 degrees C. or higher than 1,000 degrees C., the front surface of the wafer 200 is deformed and becomes difficult to absorb the microwave. Therefore, it becomes difficult to heat the wafer 200. Accordingly, it is desirable to perform the substrate processing in the above-described temperature range.

In this embodiment in which heating is performed by the microwave-based heating method, unlike the configuration of a second embodiment using a multimode applicator, a standing wave is generated in the process chamber 201. As a result, a locally-heated concentrated heating region (hot spot) and a remaining unheated region (non-heated region) are generated on the wafer 200 (also on the susceptor 103 in the case where the susceptor 103 is mounted). By controlling the ON/OFF of the power supply of the electromagnetic wave supply part in order to suppress deformation of the wafer 200 (also the susceptor 103 in the case where the susceptor 103 is mounted), it is possible to suppress generation of the hot spot on the wafer 200. At this time, the deformation of the wafer 200 can be suppressed by controlling the supply power of the electromagnetic wave supply part to become low output so as to reduce the influence of the hot spot. In this case, however, the energy irradiated onto the wafer 200 or the susceptor 103 is reduced. Therefore, the temperature rising becomes small and the heating time needs to be made long.

As described above, the temperature sensor 263 is a non-contact type temperature sensor. If the wafer 200 (or the susceptor 103, if any) as a measurement target is deformed, misaligned or broken, the position of the wafer 200 to be monitored by the temperature sensor 263 or the measurement angle with respect to the wafer 200 is changed. Therefore, the measurement value (monitoring value) is inaccurate, and the measurement temperature is abruptly changed. In this embodiment, the abrupt change in the measurement temperature of the radiation thermometer caused by the deformation or breakage of the measurement target is used as a trigger for turning on or off the electromagnetic wave supply part. The positional deviation of the susceptor is dealt with through a correction process of the position of the susceptor as described in the second embodiment.

By controlling the microwave oscillator 655 as described above, the wafer 200 is heated to modify (crystallize) the amorphous silicon film formed on the front surface of the wafer 200 into a polysilicon film (S805). That is to say, it becomes possible to uniformly modify the wafer 200. In the case where the measured temperature of the wafer 200 becomes high or low beyond the above-mentioned threshold value, the output of the microwave oscillator 655 may be controlled to be lowered without turning off the microwave oscillator 655, whereby the temperature of the wafer 200 may be set to fall within a predetermined range. In this case, when the temperature of the wafer 200 returns to the temperature falling within the predetermined range, the output of the microwave oscillator 655 is controlled to become high.

After a preset period of processing time elapses, the rotation of the boat 217, the supply of the gas, the supply of the microwave and the exhaust through the exhaust pipe are stopped.

(Substrate Unloading Step S806)

After returning the internal pressure of the process chamber 201 to the atmospheric pressure, the gate valve 205 is opened to allow the process chamber 201 and the transfer chamber 203 to be in a spatial communication with each other. Thereafter, one heated (processed) wafer 200 mounted on the boat 217 is unloaded to the transfer chamber 203 by the high-temperature tweezers 125a-2 of the transfer machine 125 (S806).

(Substrate Cooling Step S807)

One heated (processed) wafer 200 unloaded by the high-temperature tweezers 125a-2 is moved to the cooling chamber 204 in cooperation between the transfer device 125b and the transfer device elevator 125c, and is mounted on the CS 108 by the high-temperature tweezers 125a-2. Specifically, as shown in FIG. 5A, the wafer 200a subjected to the modifying process in Step S805 and held by the high-temperature tweezers 125a-2 is fed onto the wafer holding groove 107b formed in the CS 108 where the wafer 200a is mounted on the wafer holding groove 107b for a predetermined time to be cooled down (S807). At this time, as shown in FIG. 5B, when the cooled wafers 200b which have been cooled down in the preceding cooling step are mounted on the CS 108, the high-temperature tweezers 125a-2 and the low-temperature tweezers 125a-1 which mounted the wafers 200a subjected to the modifying process in Step S805 onto the wafer holding grooves 107b transfer the two cooled wafers 200b to the load port, i.e., the pod 110.

In the case where the two wafers 200 are collectively heated (processed) on the boat 217 inside the process chamber 201, the substrate unloading step S806 and the substrate cooling step S807 are continuously performed a plurality of times (in this embodiment, twice), whereby two high-temperature wafers 200a are mounted on the CS 108 one by one by the high-temperature tweezers 125a-2. At this time, when two cooled wafers 200b are mounted on the CS 108, the two cooled wafers 200b are unloaded from the CS 108 to the pod 110 by the high-temperature tweezers 125a-2 and the low-temperature tweezers 125a-1, respectively. As a result, it is possible to shorten the time during which the high-temperature tweezers 125a-2 holds the high-temperature wafer 200a. This makes it possible to reduce the heat load on the transfer machine 125. In addition, it is possible to lengthen the cooling time of the wafer 200.

As described above, the high-temperature tweezers 125a-2 is installed, and the heated (processed) high-temperature wafer 200a inside the process chamber 201 is moved to the CS 108 of the cooling chamber 204 by the high-temperature tweezers 125a-2 while being kept at a relatively high temperature and without being cooled down to, for example, 100 degrees C. or less inside the process chamber 201.

(Substrate Accommodating Step S808)

Two wafers 200 cooled down in the substrate cooling step S807 are taken out from the cooling chamber 204 by the low-temperature tweezers 125a-1 and the high-temperature tweezers 125a-2, and are transferred to the pod 110. By combining the transfer of one wafer (the loading of one wafer into the cooling chamber 204) and the transfer of two wafers (the transfer of two wafers from the cooling chamber 204) in this manner, it is possible to increase the transfer speed of the wafers 200.

By repeating the above operations, the wafers 200 are modified and a subsequent substrate processing process is performed. Although the substrate processing is performed by mounting two wafers 200 on the boat 217, the present disclosure is not limited thereto. The wafers 200 may be mounted one by one on the boat 217 installed in each of the process chambers 201-1 and 201-2 and may be subjected to the same process. Further, by performing a swap process, the wafers 200 may be processed two by two in the process chambers 201-1 and 201-2. At this time, the transfer destination of the wafers 200 may be controlled so that the number of times of the substrate processing performed in the process chamber 201-1 matches the number of times of the substrate processing performed in the process chamber 201-2. Such a control makes the number of execution times of the substrate processing performed in each of the process chambers 201-1 and 201-2 constant, which makes it possible to efficiently perform a maintenance work. For example, assuming that the process chamber to which the wafer 200 has been previously transferred is the process chamber 201-1, a subsequent wafer 200 is transferred to the process chamber 201-2. This makes it possible to control the number of execution times of the substrate processing performed in each of the process chambers 201-1 and 201-2.

According to the substrate processing apparatus of this embodiment, one or more of the following effects may be obtained.

(I) There is provided a configuration in which the number of wafers 200 (two wafers) loaded from the pod 110 into the process chamber 201 using the substrate transfer part 125 is larger than the number of wafers 200 (one wafer) transferred from the process chamber 201 to the cooling chamber 204. By combining the transfer of one wafer 200 and the transfer of two wafers 200, it is possible to increase the transfer speed of the wafers 200.

(II) The heated (processed) high-temperature wafer 200 in the process chamber 201 can be moved to the CS 108 of the cooling chamber 204 by the high-temperature tweezers 125a-2 while being kept at a relatively high temperature and without being cooled down in the process chamber 201. Therefore, it is possible to enhance the utilization efficiency of the process chamber 201 and to improve the productivity of the modifying process of the wafer 200.

(III) There is provided a configuration in which the cooling chamber 204 is installed between the process chamber 201-1 and the process chamber 201-2. As a result, the movement distance (movement time) between the process chamber 201-1 and the cooling chamber 204 can be made equal to the movement distance between the process chamber 201-2 and the cooling chamber 204, thus making the Takt times equal to each other.

(IV) By installing the cooling chamber 204 between the process chamber 201-1 and the process chamber 201-2, it is possible to improve the transfer throughput of the wafer 200.

(V) There is provided a configuration in which the CS 108 installed in the cooling chamber 204 is capable of holding four wafers 200. That is to say, the CS 108 is configured to be able to cool down at least twice as many wafers 200 (four wafers) as the wafers 200 (two wafers) heated in the process chamber 201-1 or 201-2. When the two wafers 200 are collectively heated (processed) on the boat 217 in the process chamber 201, two high-temperature wafers 200a are mounted on the CS 108 one by one by the high-temperature tweezers 125a-2. At this time, when two cooled wafers 200b are mounted on the CS 108, the two cooled wafers 200b are unloaded from the CS 108 to the pod 110 by the high-temperature tweezers 125a-2 and the low-temperature tweezers 125a-1. As a result, it is possible to shorten the time during which the high-temperature tweezers 125a-2 holds the high-temperature wafer 200a. This makes it possible to reduce the heat load on the transfer machine 125.

The configuration of the first embodiment described above may be appropriately changed and used, and the effects thereof may also be obtained. For example, in the above description, there has been described the process of modifying an amorphous silicon film as a film containing silicon as a main component into a polysilicon. However, the present disclosure is not limited thereto. The film formed on the front surface of the wafer 200 may be modified by supplying a gas containing at least one of oxygen (O), nitrogen (N), carbon (C) and hydrogen (H). For example, in the case where a hafnium oxide film ($Hf_xO_y$ film) as a high dielectric film is formed on the wafer 200, a microwave may be supplied to heat the hafnium oxide film while supplying a gas containing oxygen. This makes it possible to supplement the defective oxygen in the hafnium oxide film and to improve the characteristics of the high dielectric film.

Although the hafnium oxide film is shown herein, the present disclosure is not limited thereto. The present disclosure may be suitably applied to a case of modifying an oxide film containing at least one metal element of aluminum (Al), titanium (Ti), zirconium (Zr), tantalum (Ta), niobium (Nb), lanthanum (La), cerium (Ce), yttrium (Y), barium (Ba), strontium (Sr), calcium (Ca), lead (Pb), molybdenum (Mo), tungsten (W) and the like, namely a metal-based oxide film. That is to say, the aforementioned film-forming sequence may be suitably applied to a case of modifying a TiOCN film, a TiOC film, a TiON film, a TiO film, a ZrOCN film, a ZrOC film, a ZrON film, a ZrO film, a HfOCN film, a HfOC film, a HfON film, a HfO film, a TaOCN film, a TaOC film, a TaON film, a TaO film, a NbOCN film, a NbOC film, a NbON film, a NbO film, an AlOCN film, an AlOC film, an AlON film, an AlO film, a MoOCN film, a MoOC film, a MoON film, a MoO film, a WOCN film, a WOC film, a WON film or a WO film, which is formed on the wafer 200.

In addition to the high dielectric film, a film doped with impurities and containing silicon as a main component may be heated. Examples of the film containing silicon as a main component may include Si-based oxide films such as a silicon nitride film (SiN film), a silicon oxide film (SiO film), a silicon oxycarbide film (SiOC film), a silicon oxycarbonitride film (SiOCN film), a silicon oxynitride film (SiON film) or the like. Examples of the impurities may include at least one of bromine (B), carbon (C), nitrogen (N), aluminum (Al), phosphorus (P), gallium (Ga), arsenic (As) and the like.

Furthermore, the film may be a resist film based on at least one of a polymethyl methacrylate (PMMA) resin, an epoxy resin, a novolac resin, a polyvinyl phenyl resin and the like.

Although a process of manufacturing a semiconductor device has been described above, the present disclosure is not limited thereto but may be applied to a substrate processing technique such as a patterning process of a liquid crystal panel manufacturing process, a patterning process of a solar cell manufacturing process, a patterning process of a power device manufacturing process or the like.

Second Embodiment

The second embodiment is an example of a substrate processing apparatus that performs not only the unloading of the substrate but also the position correction of the susceptor, the unloading of the processed substrate, the loading of an unprocessed substrate and the like in the substrate unloading step S806 performed by the substrate processing apparatus described in the first embodiment. That is to say, the second embodiment is an example of a substrate processing apparatus which includes a process chamber in a substrate is processed, an electromagnetic wave supply part for supplying an electromagnetic wave to the substrate, a substrate holding part for holding a substrate and a susceptor for suppressing absorption of the electromagnetic wave onto the edge of the substrate, a substrate transfer part for transferring the substrate, and a control part configured to correct a position of the susceptor by the substrate transfer part.

Figure 7:
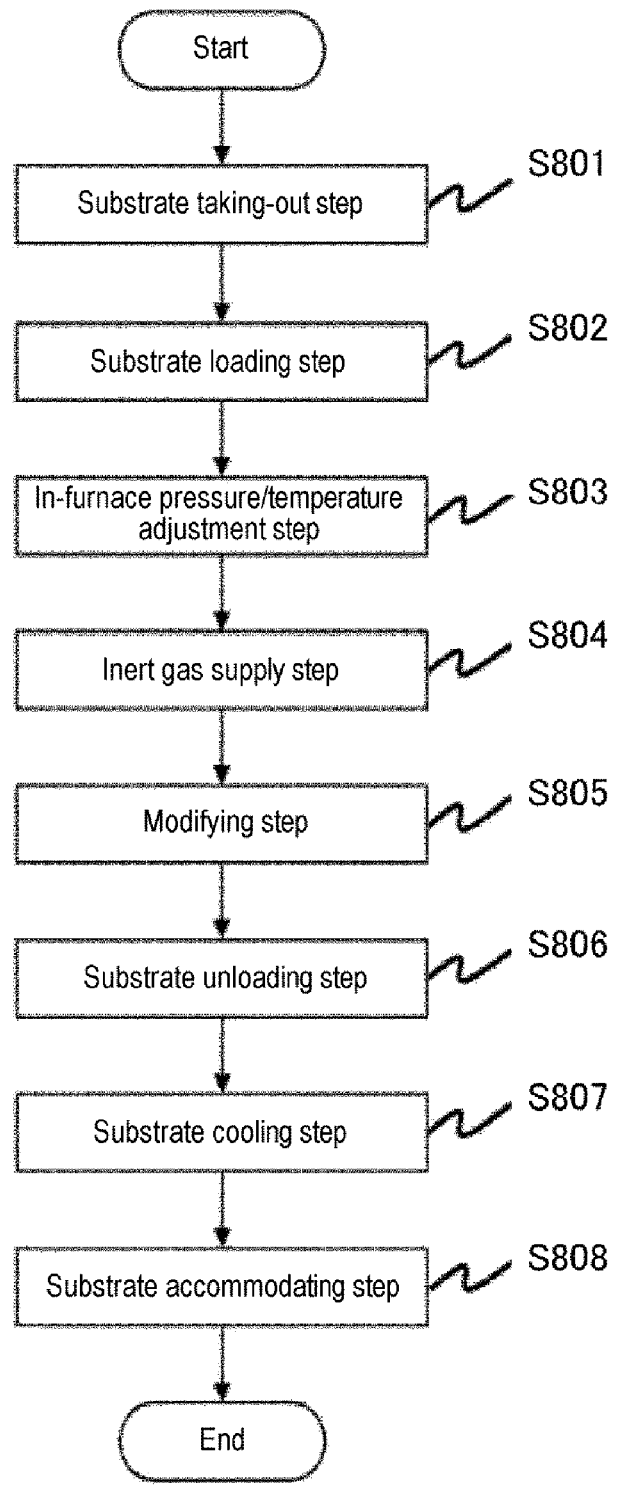
FIG. 7 is a diagram showing a flow of substrate processing in a first embodiment.

In the substrate processing flowchart of FIG. 7 described in the first embodiment, in the substrate unloading step S806, the heated substrate mounted on the boat is unloaded to the transfer chamber. In the second embodiment, however, not only the unloading of the substrate but also the position correction of the susceptor, the unloading of the processed substrate (the taking-out of the substrate from the boat) and the loading of an unprocessed substrate (the mounting of the unprocessed substrate on the boat) are performed.

In the case where the reaction chamber is a multimode applicator, a reaction chamber has a size larger than a wavelength. The microwave is multiple-reflected inside the reaction chamber, which produces a plurality of microwave modes. Therefore, if a susceptor for making uniform an electromagnetic field distribution on a semiconductor substrate is not present, an electric field is concentrated at the edge of the semiconductor substrate due to a microwave edge effect. This causes abnormal heating, which significantly deteriorates the in-plane temperature uniformity of the semiconductor substrate. The semiconductor substrate is warped largely due to the temperature difference. In the worst case, the semiconductor substrate may crack.

For this reason, it is necessary to install a susceptor for the edge effect suppression. However, even when the susceptor is installed, if the temperature of the semiconductor substrate is increased, the temperature of the substrate becomes non-uniform because the semiconductor substrate is directly heated by microwave heating. As a result, the semiconductor substrate is warped as the temperature rises. Thus, the position at which the susceptor is installed deviates. When the position of the susceptor is changed in this manner, the electromagnetic field distribution between the semiconductor substrate and the susceptor is changed, which affects the process reproducibility.

Figure 8:
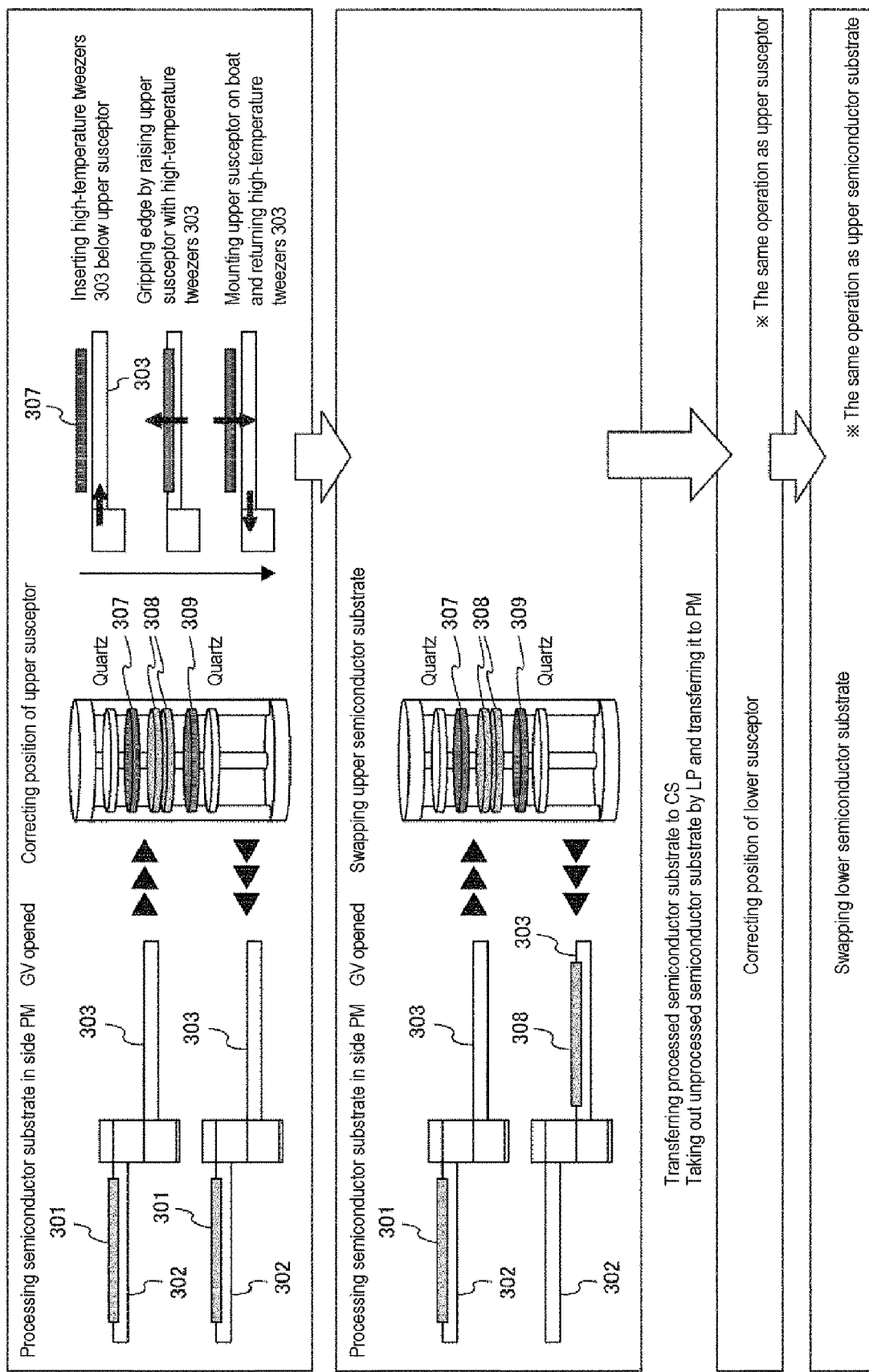
FIG. 8 is a schematic diagram for explaining the operation of a substrate processing apparatus that performs a susceptor position correction in a second embodiment.

In order to solve such a problem, the second embodiment provides a substrate processing apparatus that realizes good process reproducibility by correcting the susceptor position deviation with a substrate transfer part. That is to say, as shown in FIG. 8, one or stacked semiconductor substrate 308 is installed inside a reaction chamber, and susceptors 307 and 309 for suppressing the edge effect of the semiconductor substrate are installed above and below the semiconductor substrate. In this configuration, the positions of the semiconductor substrate 308 and the susceptors 307 and 309 are corrected by high-temperature tweezers 303 of an atmospheric boat having an edge grip. For example, the following four modes are illustrated a procedure order of correcting the position of the susceptor and further unloading the processed substrate.

(I) After the correction of the position of the susceptor, the processed semiconductor substrate is unloaded.

First, as shown in FIG. 8, in order to correct a position of an upper susceptor and to perform the swap of an upper semiconductor substrate, an unprocessed substrate 301 is mounted on the low-temperature tweezers 302 by a load port unit (LP) and the gate valve (GV) is opened. In the process chamber (PM), a position correction process for the upper susceptor 307 is performed using the high-temperature tweezers 303. Thereafter, the processed upper semiconductor substrate 308 is mounted on the high-temperature tweezers 303 and is taken out from the boat. The unprocessed substrate 301 is placed at an upper substrate holding position by the low-temperature tweezers 302. Then, the processed semiconductor substrate 308 is unloaded from the process chamber to a wafer-cooling mounting part (cooling stage: CS) by the high-temperature tweezers 303.

Subsequently, in order to correct a position of a lower susceptor and perform the swap of a lower semiconductor substrate, the unprocessed substrate is mounted on the low-temperature tweezers 302 by the LP, and a position correction process of the lower susceptor 309 is performed in the process chamber by the high-temperature tweezers 303. The processed lower semiconductor substrate 308 is mounted on the high-temperature tweezers 303 in the process chamber and is taken out from the boat. The unprocessed substrate 301 is placed at a lower substrate holding position by using the low-temperature tweezers 302. The GV is closed and the substrate processing is started. In addition, the processed semiconductor substrate 308 is unloaded from the process chamber to the CS by using the high-temperature tweezers 303.

(II) After unloading the processed substrate, the susceptor position correction is performed.

In this mode, first, the unprocessed substrate 301 is mounted on the low-temperature tweezers 302 by the LP and the GV is opened. The processed upper semiconductor substrate 308 is mounted on the high-temperature tweezers 303 in the process chamber and is taken out from the boat. The unprocessed substrate 301 is placed at the upper substrate holding position by the low-temperature tweezers 302. Furthermore, after the processed semiconductor substrate 308 is unloaded from the process chamber to the CS by the high-temperature tweezers 303, the position correction process of the upper susceptor 307 is performed by the high-temperature tweezers 303 in the process chamber. Subsequently, the processed lower semiconductor substrate 308 is mounted on the high-temperature tweezers 303 in the process chamber and is taken out from the boat. The unprocessed substrate 301 is placed at the lower substrate holding position by the low-temperature tweezers 302. After the processed semiconductor substrate 308 is transferred from the PM to the CS by the high-temperature tweezers 303, the position correction process of the lower susceptor 309 is performed in the process chamber by using the high-temperature tweezers 303. The GV is closed and the substrate processing is started.

(III) After unloading two processed substrates, the unprocessed substrate is placed and the susceptor position correction is performed.

In this mode, first, the GV is opened, the processed upper semiconductor substrate 308 is mounted on the high-temperature tweezers 303 in the process chamber, and the processed upper semiconductor substrate 308 is unloaded from the process chamber to the CS by the high-temperature tweezers 303. The processed lower semiconductor substrate 308 is mounted on the high-temperature tweezers 303 in the process chamber, and the processed semiconductor substrate 308 is transferred from the process chamber to the CS by the high-temperature tweezers 303. Two unprocessed substrates 301 are mounted on the low-temperature tweezers 302 and the high-temperature tweezers 303 by the LP, and the two unprocessed substrates 301 are placed at the upper substrate holding position and the lower substrate holding position in the process chamber. In the process chamber, the position correction process of the upper susceptor 307 is performed by the high-temperature tweezers 303. Subsequently, the position correction process of the lower susceptor 309 is performed in the process chamber by the high-temperature tweezers 303. The GV is closed and the substrate processing is started.

(IV) After unloading the two processed substrates and before mounting the unprocessed substrate, the position of the susceptor is corrected.

In this mode, first, the GV is opened, the processed upper semiconductor substrate 308 is mounted on the high-temperature tweezers 303 in the process chamber, and the processed upper semiconductor substrate 308 is unloaded from the process chamber to the CS by the high-temperature tweezers 303. The processed lower semiconductor substrate 308 is mounted on the high-temperature tweezers 303 in the process chamber, and the processed lower semiconductor substrate 308 is transferred from the process chamber to the CS by the high-temperature tweezers 303. Then, in the process chamber, the position correction process of the upper susceptor 307 is performed by the high-temperature tweezers 303. Subsequently, in the process chamber, the position correction process of the lower susceptor 309 is performed by the high-temperature tweezers 303. Thereafter, two unprocessed substrates 301 are respectively mounted on the low-temperature tweezers 302 and the high-temperature tweezers 303 by the LP, and the two unprocessed substrates 301 are placed at the upper substrate holding position and the lower substrate holding position in the process chamber, respectively. The GV is closed and the substrate processing is started. It is preferable that the low-temperature tweezers 302 for the loading and the like of the low-temperature wafer used in the respective modes of the above embodiment is made of an ordinary aluminum material, and the high-temperature tweezers 303 for the transfer of the high-temperature wafer and the room-temperature wafer is made of a material such as aluminum or quartz which has high heat resistance and poor thermal conductivity.

In this embodiment, the position correction process of the susceptor is performed once for each processing of one FOUP (25 substrates). That is to say, since two substrates are processed in one processing, the position correction process of the susceptor is performed every 13 times of processing. For example, assuming that the microwave is 10 KW and one processing time is 2 minutes, the position correction process of the susceptor is performed once every 26 minutes for each processing of one FOUP (25 substrates). As the timing of performing the position correction process of the susceptor, it is the most appropriate method to correct the position of the susceptor every time before or after semiconductor substrate processing. However, from the viewpoint of a decrease in productivity, by defining the number of processing times of the semiconductor substrate, the irradiation time of a microwave and the like, it is also possible to perform the position correction process of the susceptor for each of the number of processing times or the irradiation time. That is to say, after the processing of the semiconductor substrate is repeated a predetermined number of times, the substrate transfer part may correct the position of the susceptor. Alternatively, after the irradiation time of the electromagnetic wave has elapsed a predetermined period of time, the substrate transfer part may correct the position of the susceptor.

Figure 9:
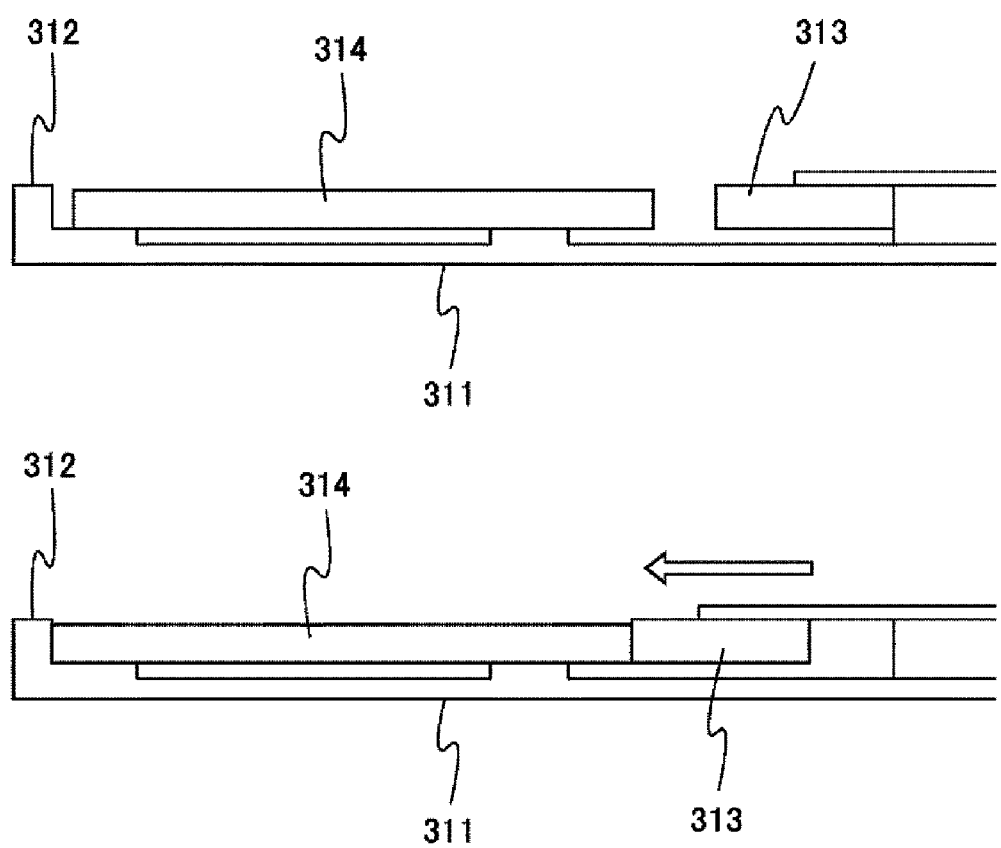
FIG. 9 is a diagram illustrating a configuration example of a substrate transfer part that performs the susceptor position correction in the second embodiment.

FIG. 9 schematically shows an example of a case where a susceptor or the like sandwiched by edge grips of a low-temperature tweezers and a high-temperature tweezers which are a substrate transfer part in this embodiment. As shown in FIG. 9, the edge of a semiconductor substrate or a susceptor 314 is sandwiched by edge grips 312 and 313 of each tweezers 311 used as the substrate transfer part, thereby correcting the position.

As described above, according to this embodiment, in the reaction chamber as the multimode applicator, the position of the susceptor is corrected to the original installation position by grasping the susceptor with the atmospheric robot before and after performing the semiconductor substrate processing. Thus, the susceptor returns to the original installation position and does not affect the semiconductor substrate processing. This makes it possible to secure the process reproducibility.

The present disclosure is not limited to the above-described embodiments and may include various modifications. For example, the above-described embodiments have been described in detail for a better understanding of the present disclosure and are not necessarily limited to those having all the configurations of the description. In addition, it is possible to replace some of the configurations of one embodiment with the configurations of another embodiment, and it is possible to add the configurations of another embodiment to the configurations of one embodiment. In addition, it is possible to add, delete and replace other configurations with respect to some of the configurations of each embodiment.

Furthermore, there has been described an example of preparing a program for realizing some or all of the above-described configurations, functions, control devices and the like. It goes without saying that some or all of the above-described configurations, functions, control devices and the like may be implemented by hardware by designing them as an integrated circuit. That is to say, some or all functions of the processing part may be realized by an integrated circuit such as an ASIC (Application Specific Integrated Circuit), a FPGA (Field Programmable Gate Array) or the like instead of a program.

According to the present disclosure, it is possible to provide a substrate processing apparatus capable of suppressing a decrease in productivity. Furthermore, according to the present disclosure, it is possible to provide a technique capable of assuring process reproducibility by correcting a position of a susceptor.

What is claimed is:

1. A substrate processing apparatus, comprising:
a process chamber in which at least one substrate is processed;
an electromagnetic wave supply part installed on a first side surface of the process chamber, and configured to supply an electromagnetic wave to the at least one substrate;
a substrate holding part installed inside the process chamber, and configured to hold the at least one substrate and at least one susceptor for suppressing the electromagnetic wave from being adsorbed to an edge of the at least one substrate;
a substrate loading/unloading port installed on a second side surface of the process chamber, which faces the electromagnetic wave supply part, and capable of loading and unloading the at least one substrate into and from the process chamber;
a cooling chamber configured to cool the at least one substrate unloaded from the process chamber after the at least one substrate is processed inside the process chamber
a substrate transfer part comprising:
a high-temperature substrate transfer part configured to transfer an unprocessed substrate from a pod to the process chamber, transfer a processed substrate from the process chamber to the cooling chamber, and transfer a cooled substrate from the cooling chamber to the pod; and
a low-temperature substrate transfer part configured to transfer an unprocessed substrate from the pod to the process chamber, and transfer a cooled substrate from the cooling chamber to the pod; and
a controller configured to control the high-temperature substrate transfer part so as to correct a position of the at least one susceptor through the substrate loading/unloading port;
wherein the controller controls the substrate transfer part so as to correct the position of the at least one susceptor by the high-temperature substrate transfer part after an irradiation time of the electromagnetic wave has elapsed a predetermined period of time; and
wherein the substrate transfer part is configured to correct the position of the at least one susceptor by sandwiching an edge portion of the at least one susceptor with grips of the high-temperature substrate transfer part.

2. The apparatus of claim 1, wherein the controller controls the substrate transfer part so as to correct the position of the at least one susceptor before the unprocessed substrate loaded by the low-temperature substrate transfer part in the process chamber is processed or after the unprocessed substrate is processed.

3. The apparatus of claim 1, wherein the controller controls the substrate transfer part so as to correct the position of the at least one susceptor before or after the processed substrate processed inside the process chamber is unloaded from the process chamber by the high-temperature substrate transfer part.

4. The apparatus of claim 1, wherein the at least one susceptor includes an upper susceptor and a lower susceptor, and
wherein the upper susceptor is disposed above the at least one substrate and the lower susceptor is disposed below the at least one substrate.

5. The apparatus of claim 4, wherein the controller controls the substrate transfer part so as to correct a position of the upper susceptor disposed above the at least one substrate and a position of the lower susceptor disposed below the at least one substrate before or after the at least one substrate is processed.

6. The apparatus of claim 4, wherein the controller controls the substrate transfer part so as to correct a position of the upper susceptor disposed above the at least one substrate and a position of the lower susceptor disposed below the at least one substrate before or after the at least one substrate processed inside the process chamber is unloaded from the process chamber by the substrate transfer part.

7. The apparatus of claim 1, wherein the controller controls the substrate transfer part so as to correct the position of the at least one susceptor by the high-temperature substrate transfer part after the at least one substrate is repeatedly processed a predetermined number of times.

8. The apparatus of claim 1, wherein the at least one substrate includes a plurality of substrates,
the process chamber is a chamber configured to process the plurality of substrates held by the substrate holding part, and
the controller controls the substrate transfer part so as to correct the position of the at least one susceptor by the high-temperature substrate transfer part before or after the plurality of substrates that have been processed inside the process chamber are unloaded from the process chamber by the high-temperature substrate transfer part.

9. The apparatus of claim 1, wherein the controller controls the substrate transfer part so as to correct the position of the at least one susceptor before or after the at least one substrate is mounted on the substrate holding part.

10. The apparatus of claim 1, further comprising a cooling chamber positioned adjacent to the process chamber, and configured to cool the at least one substrate unloaded from the process chamber after the at least one substrate is processed inside the process chamber.

* * * * *